United States Patent [19]

[11] 3,910,801

Cline et al.

[45] Oct. 7, 1975

[54] HIGH VELOCITY THERMAL MIGRATION METHOD OF MAKING DEEP DIODES

[75] Inventors: Harvey E. Cline; Thomas R. Anthony, both of Schenectady, N.Y.

[73] Assignee: General Electric Company, Schenectady, N.Y.

[22] Filed: Oct. 30, 1973

[21] Appl. No.: 411,021

[52] U.S. Cl. .................. 148/1.5; 148/1.6; 148/177; 148/179; 252/62.3 E; 252/62.3 GA; 29/583

[51] Int. Cl.[2] .............................................. H01L 7/42

[58] Field of Search ............................ 148/171–173, 148/1.5, 1.6, 177, 179; 252/62.3 GA, 62.3 E; 29/583

[56] References Cited

UNITED STATES PATENTS

| | | | |
|---|---|---|---|
| 2,419,237 | 4/1947 | Treuting | 148/189 UX |
| 2,813,048 | 11/1957 | Pfann | 148/1 |
| 3,340,601 | 9/1967 | Garibotti | 148/1.5 X |
| 3,360,851 | 1/1968 | Kahng et al. | 148/188 X |
| 3,484,302 | 12/1969 | Maeda et al. | 148/1.5 |

*Primary Examiner*—G. Ozaki
*Attorney, Agent, or Firm*—Charles T. Watts; Joseph T. Cohen; Jerome C. Squillaro

[57] ABSTRACT

A number of semiconductor devices are simultaneously produced by thermally migrating aluminum droplets rapidly through an elongated, cylindrical, silicon crystal under the driving force of heat from a source relative to which the crystal is moved axially to provide a plurality of recrystallized regions extending through the crystal parallel to its axis. As the second step of the process, the crystal is cut transversely at a number of points along its length to provide a plurality of semiconductor devices which are counterparts of one another.

7 Claims, 4 Drawing Figures

HIGH VELOCITY THERMAL MIGRATION METHOD OF MAKING DEEP DIODES

The present invention relates generally to the thermal gradient zone melting art and is more particularly concerned with a novel method for simultaneously producing a number of counterpart semiconductor devices.

CROSS REFERENCES

This invention is related to those of the following patent application assigned to the assignee hereof and filed of even date herewith:

U.S. Pat. Application Ser. No. 411,150, filed Oct. 30, 1973, entitled "Method of Making Deep Diode Devices" in the names of Thomas R. Anthony and Harvey E. Cline, which discloses and claims the concept of embedding or depositing the solid source of the migrating species within the matrix body instead of on that body to overcome the tendency for migration to be irregular and to lead to non-uniformity in location and spacing of the desired P-N junctions.

U.S. Pat. Application Ser. No. 411,015, filed Oct. 30, 1973, entitled "Deep Diode Devices and Method and Apparatus" in the names of Thomas R. Anthony and Harvey E. Cline, which discloses and claims the concept of carrying out thermal gradient zone melting at relatively high temperatures including temperatures approaching the melting point temperature of the material of the matrix body.

U.S. Pat. Application Ser. No. 411,009, filed Oct. 30, 1973, entitled "Deep Diode Device Having Dislocation-Free P-N Junctions and Method" in the names of Thomas R. Anthony and Harvey E. Cline, which discloses and claims the concept of minimizing the random walk of a migrating droplet in a thermal gradient zone melting operation by maintaining a thermal gradient a few degrees off the [100] axial direction of the crystal matrix body and thereby overwhelming the detrimental dislocation intersection effect.

U.S. Pat. Application Ser. No. 411,008, filed Oct. 30, 1973, entitled "The Stabilized Droplet Method of Making Deep Diodes Having Uniform Electrical Properties" in the names of Harvey E. Cline and Thomas R. Anthony, which discloses and claims the concept of controlling the cross-sectional size of a migrating droplet on the basis of the discovery that one millimeter is the critical thickness dimension for droplet physical stability.

BACKGROUND OF THE INVENTION

The thermal gradient zone melting or thermomigration method of deep diode production has been recognized over the past two decades as holding important advantages over commercially established diffusion and epitaxial methods of semiconductor device production. The problem has been to find the way to make the desired products consistently through thermomigration, that being impossible heretofore even under the most favorable experimental conditions. Now, however, the way has been opened to that goal by means of the inventions and discoveries disclosed and claimed in several of our copending cases referred to above.

SUMMARY OF THE INVENTION

Taking advantage of the opportunity offered by these discoveries and inventions, we have now conceived of a way in which the production capacity of a thermomigration facility can be multiplied many fold without incurring any process or product disadvantage of economy or quality. Thus, according to this invention, many semiconductor devices, suitably exact counterparts, can be made simultaneously in one operation which includes a thermomigration step followed by a cutting step. The initial pattern of the selected diode array is in preferred practice maintained as droplets are migrated through the length of a relatively thicker elongated semiconductor crystal workpiece using the concepts of copending applications Ser. No. 411,015, Ser. No. 411,150, Ser. No. 411,009, and Ser. No. 411,008.

Briefly described, this novel method comprises the steps of providing a matrix body of semiconducting material which has end surfaces and a side surface and is relatively long or thick compared with the desired wafers to be described, forming a recess in one end surface of the body, depositing in the recess in solid form a fusible second material, i.e., a metal which will form a liquid solution of the matrix body material at a temperature below the melting point temperature of the matrix body. The method also includes the steps of heating the metallic material and forming a liquid solution of the matrix material, and then migrating the resulting droplet toward the other end surface of the matrix body, and finally after the migration stage has been completed, cutting the matrix body transversely in a number of locations along its length to provide a plurality of separate semiconductor devices suitably of the same thickness but possibly of different selected thicknesses, as desired.

DESCRIPTION OF THE DRAWINGS

The method of this invention in the preferred form is illustrated in the drawings accompanying and forming a part of the specification, in which.

Figures 1, 2, 3, 4:
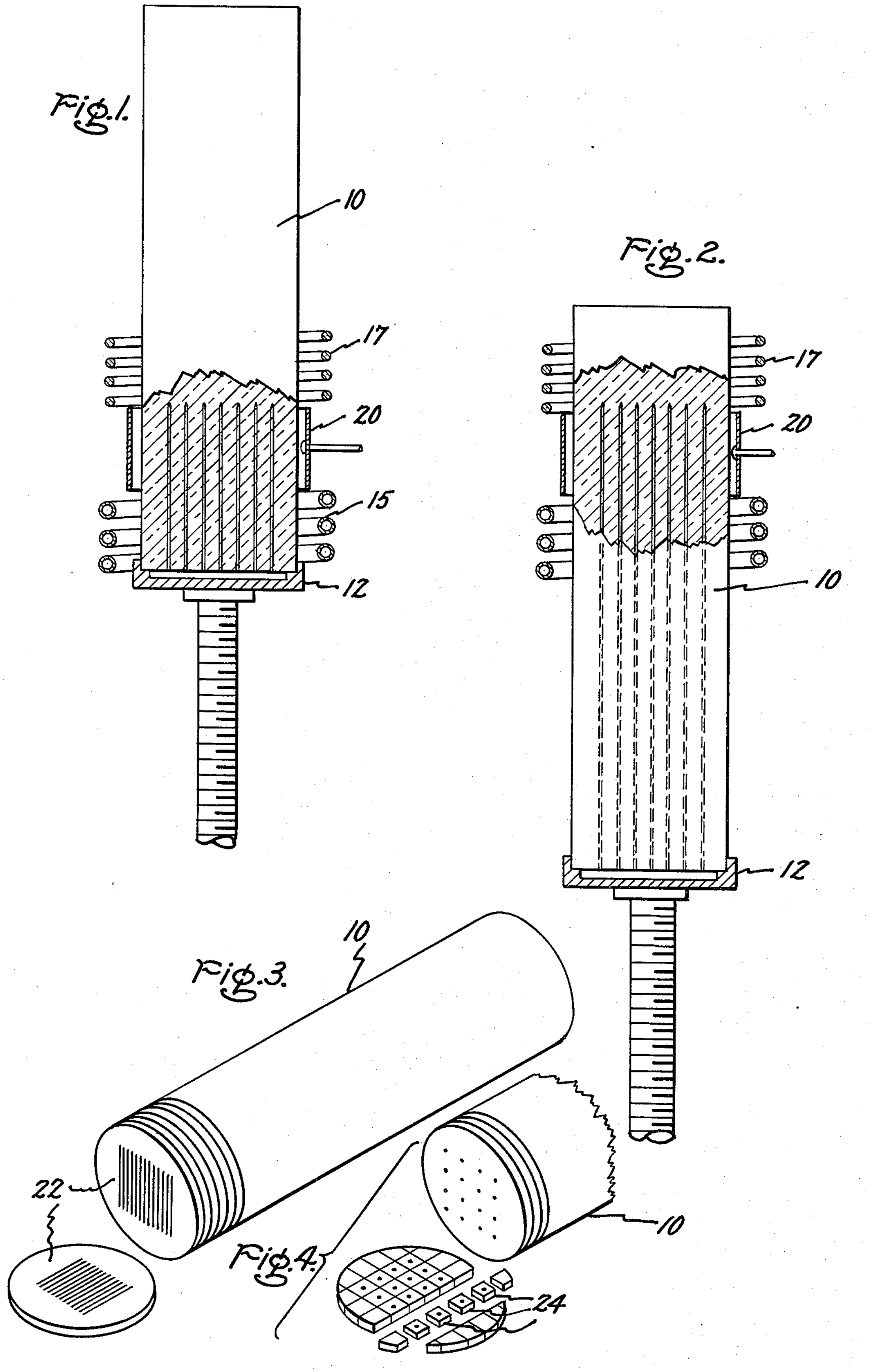
FIG. 1 is a side elevational view of an elongated silicon crystal and associated apparatus supporting the crystal in position relative to cooling and heating stations for control of the droplet thermomigration process.
FIG. 2 is a view similar to that of FIG. 1 showing the advance of the silicon crystal in timed relation to the progress of the thermomigration process.
FIG. 3 is a perspective view of the silicon crystal of FIGS. 1 and 2 after completion of the thermomigration process and at the outset of a cutting operation constituting the final stage of the invention process.
FIG. 4 is a view in perspective showing another cutting operation involved in the final stage of the process.

As illustrated in the drawings, the method of this invention as applied to a long, single crystal, silicon rod 10 involves mounting the rod on an axially-movable support 12 secured at the cold lower end of the rod for travel of successive longitudinal portions of the rod through a cooling station 15 and a heating station 17 located thereabove. The supporting structure can be of any desired form and involve any suitable conventional mechanism for automatically or manually advancing rod 10 through stations 15 and 17 as the thermomigration process proceeds. Similarly, the source of coolant and the heating source may be chosen according to the preferences of the operator, recognizing that unidirectional heat flow through the section of the rod 10 in which migration is occurring is essential to the production of straight-line droplet migration trajectories and the retention of registry of grid patterns, as disclosed and claimed in copending application Ser. No. 411,001, filed Oct. 30, 1973. As heating and cooling means, we prefer to use a high frequency induction coil (the workpiece serving as its own susceptor), and a copper coil through which tap water is run continuously. Both coils are spaced uniformly two centimeters from rod 10.

A tubular heat shield 20 in the form of a zirconium sheet receives the portion of rod 10 between the coils of stations 15 and 17, preventing significant heat flow laterally of rod 10 in that part where droplet migration is in progress. Shield 20 is spaced uniformly about 5 millimeters from rod 10.

As the preliminary step in this process, the surface of the lower end of rod 10 is prepared as disclosed and claimed in copending application Ser. No. 411,150, filed Oct. 30, 1973, the desired deposit or deposits of aluminum in solid form being provided thereby in recesses formed in the lower end surface of rod 10, as indicated in FIGS. 3 and 4. With this operation accomplished, the rod is mounted in the support equipment as shown in FIG. 1 but with the induction coil energized to heat rod 10 and start the thermomigration process by melting the aluminum deposits at the lower end of the rod. As the thermomigration process proceeds to the stage indicated in FIG. 1, the cooling coil is charged with water flowing continuously to effect cooling to the portion of the rod surrounded by the coil (at 15) to maintain the desired thermal gradient in the section of the rod through which the thermomigration is being carried on. Preferably, travel of the rod relative to the cooling and heating stations is continuous at a rate matching the thermomigration rate with the result that the droplets continue their upward course toward the top of the rod, maintaining the position relative to the induction coil (at 17) shown in FIG. 1 as indicated in the later stage shown in FIG. 2. Suitably, however, the progress of the rod through the stations can be intermittent as long as care is taken to maintain the active thermomigration sites (i.e., the droplets) above the cooling station and below the highest temperature level of the heating station.

In the preferred practice of this invention, the method disclosed and claimed in our copending application Ser. No. 411,015, filed Oct. 30, 1973 is employed to accelerate droplet migration. Thus, the maximum temperature in rod 10 in the illustrated embodiment is maintained at 1,200°C throughout the droplet migration period. The thermal gradient is maintained at about 50°C and droplet migration is at a uniform rate of about 0.8 mm per hour. This rate is independent of droplet form, i.e., "wire" or spheroid-like.

When the thermomigration process has been concluded by the arrival of the droplets at the upper end surface of rod 10, or at some earlier time at the choice of the operator, such as illustrated in FIG. 2 or even FIG. 1, the rod is removed from the thermomigration apparatus and reduced to short segments or wafers. Actually, in the case of silicon crystal rod workpieces, this preferably involves scoring and separating along cleavage planes to provide wafers of selected uniform width or varying widths according to choice. This stage of the process is illustrated in FIG. 3 wherein it is seen that by maintaining the integrity, i.e., the spacing and pattern geometry of the original droplet design, a number of counterpart semiconducting devices 22 such as diodes or lead-throughs as described in detail elsewhere herein may be provided for a variety of uses. Further multiplication of the products of this process can be realized through the further separating of individual semiconductor components 24 from the original pattern, as illustrated in FIG. 4.

From the foregoing, it will be apparent that this invention provides basically a two-step process for mass or large-scale production of semiconductive devices of high quality in virtually any desired geometry. In a sense, this is basically a batch process but as a practical matter it may be regarded as being continuous in that its capacity for the production of counterpart semiconductor devices is so great that the total requirement for such devices in a normal interval of time can be made in a single production run through the thermomigration and the separating stages. For example, the above method would be useful in producing light emitting diodes by migration of an array of gallium droplets through gallium phosphide. After migration, the ingot is wafered and then diced to produce a large number of light emitting diodes.

In the devices of this invention, the trails left by the migrating droplets are actually regions of recrystallized material. The conductivity and resistivity of the crystal and the recrystallized region in each instance will be different so that these trails or recrystallized regions will form with the matrix body crystal P-N junctions suitably of the step type if desired. Alternatively, they may serve instead as lead-throughs if P-N junction characteristic does not exist in the structure. Recrystallized regions thus may be suitably doped with the material comprising the migrating droplet, that is, in admixture with the droplet metal, so as to provide impurity concentration sufficient to obtain the desired conductivity. The metal retained in the recrystallized region in each instance is substantially the maximum allowed by the solid solubility in the semi-conductive material. It is a semiconductor material with maximum solid solubility of the impurity therein. It is not semiconductor material which has liquid solubility of the material. Neither is it a semiconductor material which is or contains a eutectic material. Further, such recrystallized region has a constant uniform level of impurity concentration throughout the length of the region or trail and the thickness of the recrystallized region is substantially constant throughout its depth or length.

While it is convenient in using aluminum to deposit the source of migrating droplet material under a vacuum of $1 \times 10^{-5}$ torr, it is to be understood that other vacuum conditions may be employed, particularly higher vacuums, and that lesser vacuums down to $3 \times 10^{-5}$ torr may be used with satisfactory results. We have found, however, that particularly in the case of aluminum, difficulty may be encountered in initiating droplet migration due to interference of oxygen with wetting of silicon by the aluminum when pressures greater than $3 \times 10^{-5}$ torr are used in this operation. Similarly, aluminum deposited by sputtering will be by virtue of saturation difficult to use in this process of ours so far as initiation of the droplet penetration action is concerned. Our preference, accordingly, is for an aluminum vapor deposition procedure which prevents more than inconsequential amounts of oxygen from being trapped in the aluminum deposits, as disclosed and claimed in copending patent application Ser. No. 411,150 referenced above.

As a general proposition in carrying out the process of this invention and particularly the stage of forming the recesses or pits in the surface of the matrix body crystal to receive deposits of solid droplet source material, the depth of the recesses should not be greater than about 25 to 30 microns. This is for the purpose of avoiding the undercutting of the masking layer which would be detrimental in that the width of the droplet to be migrated might be too great or, in the extreme case, that the contact between the droplet and the matrix body surface would be limited to the extent that initiation of migration would be difficult and uncertain. In the normal use of the present invention process, as disclosed in above-referenced patent application Ser. No. 411,150, the etching operation providing these recesses will be carried on for approximately 5 minutes at a temperature of 25°C with a mixed acid solution to provide a recess depth of about 25 microns with a window opening size of from 10 to 500 microns according to the size of the opening defined by the mask.

The wafer or workpiece semiconductor material body used in this invention process may be other than silicon, such as silicon carbide, germanium, gallium arsenide, a compound of a Group II element and a Group VI element, or a compound of a Group III element and a Group V element. Likewise, the material of the migrating species can be other than pure or suitably-doped aluminum, which is fusible and capable of forming a liquid solution with the material of the matrix body or wafer to provide a recrystallized region of selected conductivity and resistivity different from that of the wafer as it is migrated therethrough. If the conductivity is opposite to that of the matrix material, a P-N junction would be created at the interface of the two different materials. Also, the wafer or matrix body material and the migrating species should be selected so as to insure that the melting point temperature of the former is above, and preferably substantially above, the melting point temperature of the liquid solution of the migrating species material and the wafer or matrix body material.

What we claim as new and desire to secure by Letters Patent of the United States is:

1. The thermal migration method for simultaneously producing a plurality of semiconductor bodies which comprises the steps of providing a monocrystalline matrix body of semiconductor material having selected conductivity and resistivity and having end surfaces and a side surface, forming recesses of depth less than about 30 microns in one end surface of the matrix body, substantially filling the recesses with a solid metallic material of different selected conductivity and resistivity with which the matrix body material will form a liquid solution of melting point temperature below that of the material of the matrix body, heating the matrix body and thereby forming in the recesses liquid solutions of the matrix material and the metallic material, migrating the resulting droplet in each recess toward the other end surface of the matrix body in a straight preselected path through the matrix body by establishing and maintaining a finite thermal gradient in a first direction through the said body and establishing and maintaining a zero thermal gradient through the said body in a direction normal to the first direction, and thereafter sectioning the matrix body transversely at a number of locations along its length to provide a plurality of separate semiconductor bodies.

2. The method of claim 1 in which the matrix body is an elongated, generally cylindrical crystal of silicon, the thermal gradient is about 50°C per centimeter and in which the migration paths of the droplets are marked by recrystallized regions extending in straight lines substantially parallel to the major axis of the matrix body.

3. The method of claim 2 in which the recrystallized region extends the full length of the matrix body.

4. The method of claim 1 in which the body is a silicon crystal and in which the metallic material is aluminum.

5. The method of claim 1 in which heating of the metallic material is accomplished by heating the matrix body at an intermediate location along its length and progressively moving the heating location along the matrix body in a direction away from its recessed end.

6. The method of claim 1 in which the matrix body is a crystal selected from the group consisting of gallium arsenide and gallium phosphide.

7. The method of claim 1 in which the sectioning step is carried out by scoring the matrix body and then fracturing the body along a cleavage plane.

* * * * *